United States Patent
Mock et al.

[11] Patent Number: 5,850,109
[45] Date of Patent: Dec. 15, 1998

[54] MAGNETOSTRICTIVE ACTUATOR

[75] Inventors: Randolf Mock, München; Hans Meixner, Haar; Andreas Kappel, München, all of Germany

[73] Assignee: Siemens Atkiengesellschaft, Munich, Germany

[21] Appl. No.: 913,402
[22] PCT Filed: Mar. 5, 1996
[86] PCT No.: PCT/DE96/00384
  § 371 Date: Sep. 12, 1997
  § 102(e) Date: Sep. 12, 1997
[87] PCT Pub. No.: WO96/29748
  PCT Pub. Date: Sep. 26, 1996

[30] Foreign Application Priority Data
Mar. 21, 1995 [DE] Germany ............... 195 10 249.5

[51] Int. Cl.⁶ .................................................. H01L 41/12
[52] U.S. Cl. .................................................. 310/26
[58] Field of Search ....................................... 310/26

[56] References Cited

U.S. PATENT DOCUMENTS

| | | | |
|---|---|---|---|
| 3,379,905 | 4/1968 | Janssen ............................. | 310/26 |
| 3,612,924 | 10/1971 | Semmelink ....................... | 310/26 |
| 3,701,983 | 10/1972 | Franklin et al. ................. | 340/174 QA |
| 3,783,505 | 1/1974 | Schoen ............................. | 29/609 |
| 4,032,929 | 6/1977 | Fischbeck et al. ............... | 346/140 R |
| 4,757,219 | 7/1988 | Yamauchi et al. ................ | 310/26 |
| 5,313,834 | 5/1994 | Lagace .............................. | 73/290 V |
| 5,595,830 | 1/1997 | Daughton .......................... | 428/611 |

FOREIGN PATENT DOCUMENTS

| | | | |
|---|---|---|---|
| 0 251 468 | 7/1988 | European Pat. Off. ...... | H01L 41/12 |
| 42 20226 A1 | 12/1993 | Germany ..................... | H01L 41/12 |
| 91/01814 | 2/1991 | WIPO . | |

OTHER PUBLICATIONS

Hartmut Janocha, Aktoren, Grundlagen und Anwendungen, Springer Verlag (1992) pp. 278–293.

*Primary Examiner*—Thomas Dougherty
*Attorney, Agent, or Firm*—Hill & Simpson

[57] ABSTRACT

Drive elements whose physical volume is considerably smaller than piezoelectric actuators for comparable mechanical characteristics and actuation travels can be developed on the basis of the magnetostrictive material $Tb_xDy_{1-x}Fe_2$ (Terfenol). Despite these characteristics, magnetostrictive actuators have until now been used only where no rapid switching processes or actuation movements are required. An actuator of compact construction responds to an electrical drive signal very quickly and can produce large actuation forces. The actuator typically contains N≈100 drive elements (1, 1') which are arranged one above the other in the form of a stack, are each of layered construction, and are provided with electrical connections. The drive elements (1, 1') each have a small metal plate (4, 4'), which is arranged between two insulators (2, 2', 3, 3'), and an actuator element (5, 5') which is manufactured from Terfenol. When current flows through it, the small metal plate (4, 4'), which is slotted in a U-shape, acts as a planar annular coil whose magnetic field passes through the actuator element (5, 5') and causes magnetostriction there.

21 Claims, 5 Drawing Sheets

MAGNETOSTRICTIVE ACTUATOR

BACKGROUND OF THE INVENTION

The spontaneous length and shape change of magnetic substances in an external magnetic field which varies the magnetization direction is called magnetostriction. This effect is used in particular in so-called actuators, in order to convert electrical or magnetic energy into mechanical energy (see, for example, Janocha; Aktoren, Grundlagen and Anwendugan (Actuators, principles and applications), Springer Press (1992), pages 278–293. The magnetostrictive effect often depends in a complicated manner on the magnetization direction, but not on its mathematical sign. Magnetostrictive materials expand only to a comparatively small extent in the magnetic field. Relative length changes in the range from $\Delta l/l \approx 10^{-5}$ to $10^{-6}$ are thus observed in alloys having the components iron, nickel or cobalt. The magnetostrictive effect is considerably more evident in rare-earth metal/iron alloys, where values of up to $\Delta l/l \approx 3 \cdot 10^{-3}$ are formed.

The material $Tb_xDy_{1-x}Fe_2$ (TERFENOL-D: x=0.3), which was developed in the United States at the start of the 1960s and is known by the trade name TERFENOL, achieved particular importance in the production of magnetostrictive actuators. Miniaturized drive elements can be developed on the basis of this material, which is characterized by the parameters quoted below (the corresponding values for PXE 52 piczo-ceramic arc quoted in brackets),

| Relative change length | $\Delta l/l$ | 2–3 | ($\leq 1.5$) | $10^{-3}$ |
|---|---|---|---|---|
| Energy density | $E_v$ | 14 ... 25 | (1) | $10^3 Ws/m^3$ |
| Compression strength | $T_t$ | 700 | (>600) | $N/mm^2$ |
| Tensile strength | $T_p$ | 28 | ($\approx 80$) | $N/mm^2$ |
| Thermal conductivity | $\lambda$ | 110 | (1,2) | W/mK |
| Resistivity | $\rho_{el}$ | 0,6 | | $10^{-6}$ $\Omega$m |
| Curie-Temperature | $\delta_C$ | 380 | (165) | °C. |
| Density | $\rho$ | 9,25 | (7,8) | $kg/m^3$ | and their physical volume is considerably smaller than piezoelectric actuators for comparable mechanical characteristics and actuation travels.

The head of the ink jet printer which is known from U.S. Pat. No. 4,032,929, said head being opposite a roll which is covered with paper, has a multiplicity of nozzles which are arranged in a line and each of which is connected to a chamber and a reservoir for the printing medium. The nozzle plate, the reservoir and two membranes which are separated from one another by spacers form the chamber walls. The membranes are of layered construction, the outer layers each being composed of nickel, and the layers on the chamber side being composed, for example, of an Fe—Co—Ni alloy. Since these materials expand to a greatly different extent in an external magnetic field, the volume of the chambers can be varied individually by passing current through appropriately positioned conductor elements. Metallizations are used as conductor elements which are composed of copper, are sheathed in an electrical insulator and are arranged on the outer and chamber-side membrane surfaces.

A thin magnetostrictive film which is arranged on a bending element forms the active component of the electromechanical transducer which is known from German reference DE 42 20 226 A1. The external magnetic field which causes the magnetostriction is produced by a conventional air-cored coil or a conductor track system which is produced using thick-film technology. In order to reinforce the magnetic field in the region of the magnetostrictive material, the thin film is sheathed with a soft-magnetic material (Fe—Ni alloy).

U.S. Pat. No. 4,757,219 describes a magnetostrictive actuator which is of laminar construction and whose layers, which are each only about 80 $\mu$m thick, are composed of an amorphous alloy containing iron.

With regard to compactness and response times, the magnetostrictive drive elements, which produce comparatively large actuation forces and are equipped with conventional coils, are considerably inferior to correspondingly designed piezo-actuators. For example, the response time of piezo-ceramic transducers is typically 50 $\mu$s to 100 $\mu$s, while that of magnetostrictive transducers is at least 1 $\mu$s—10 ms. This is due to the fact that the magnetic field must have a minimum strength in the region of the actuator, and this defines the minimum possible inductance of the cylindrical coil which produces the field, and thus also the minimum response time, which cannot be reduced. In addition, the coil which encloses the magnetostrictive element and the parts which are used to guide the magnetic flux occupy a very large amount of space. This places tight limits on the desired miniaturization of the actuators and makes it harder to use them as a drive for pumps, injection valves, sound transducers etc.

SUMMARY OF THE INVENTION

The aim of the invention is to provide a magnetostrictive actuator which is of compact construction and can produce large actuation forces. In general terms the present invention is a magnetostrictive actuator having a number $N \geq 2$ of drive elements. The drive elements have a layered construction. Each of the drive elements has a planar conductor element which is provided with electrical connections, an actuator element which is composed of a magnetostrictive material, and an electrical insulator which is arranged between the conductor element and the actuator element. The conductor elements, which are designed in a U-shape or provided with a slot, are arranged at offset angles one above the other within a stack of the drive elements such that a magnetic field is built up which is oriented in the direction of the stack axis.

In a further embodiment of the present invention adjacent conductor elements are arranged offset at an angle of 180° one above the other. In another embodiment the conductor elements are each arranged between two insulators.

The present invention is also a magnetostrictive actuator having the following features. The actuator contains a number $N \geq 2$ of planar conductor elements which are separated from one another by electrical insulators. The conductor elements are manufactured from a magnetostrictive material. Each is provided with electrical connections. They are arranged one above the other in the form of a stack such that, when current is flowing, they produce a magnetic field which is oriented in the direction of the stack axis.

The present invention is also a magnetostrictive actuator having the following features. The actuator contains a number $N \geq 2$ of planar conductor elements which are separated from one another by electrical insulators. The conductor elements are manufactured from a magnetostrictive material. They are electrically connected in series and arranged one above the other in the form of a stack such that the current which is supplied to a connection of a first conductor element and flows away via a connection of the N-th conductor element produces a magnetic field which is oriented in the direction of the stack axis.

Advantageous developments of the present invention are as follows.

The conductor elements are designed as planar annular coils.

The conductor elements are slotted conductor elements in the form of plates, disks or rings.

The conductor elements are arranged at offset angles one above the other.

The conductor elements are arranged at offset angles one above the other such that a helical current path is produced.

The conductor or actuator elements, which are composed of a magnetostrictive material, are coated with an electrically conductive material, or the conductor and/or actuator elements are mounted on an electrically conductive layer.

The electrically conductive material has ferromagnetic characteristics and/or the electrically conductive layer is composed of a ferromagnetic material.

The insulators are composed of a dielectric, an insulating film or an insulating varnish and are produced by oxidation of the surface of the magnetostrictive material or by oxidation of the surface of the conductor elements.

Integrating the field-producing coil in the drive element makes it possible to construct compact actuators which can produce large actuation forces of, for example, 2000 N–5000 N. In known magnetostrictive actuators, the components which produce the actuation travel and the magnetic field are functionally separated from one another. The invention largely overcomes this separation since the magnetostrictive layers, which are provided with electrical connections, are themselves used as coil elements.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED ENBODIMENTS

Figure 1:
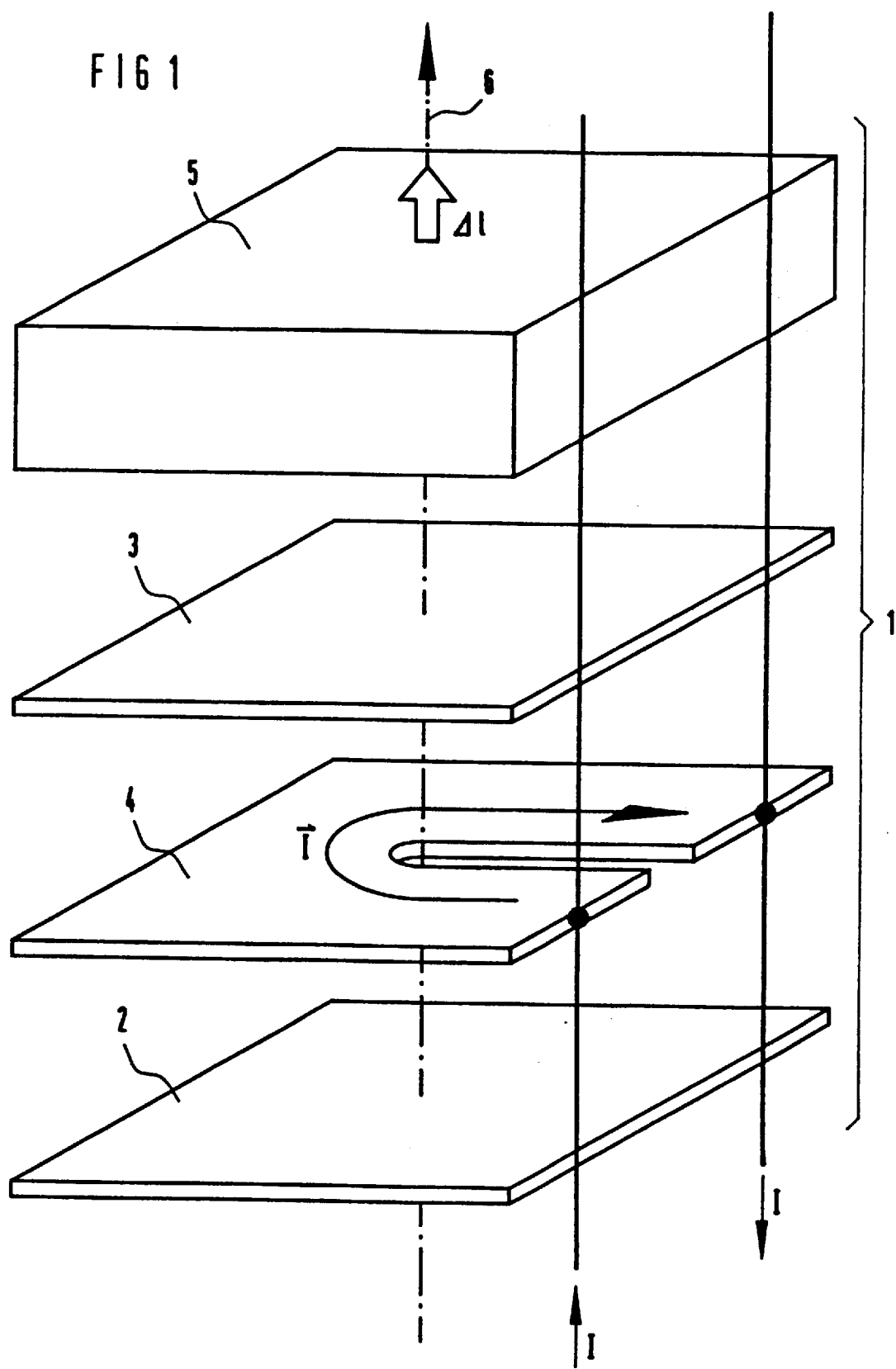
FIG. 1 shows a drive element of the actuator.

An actuator according to the invention typically contains about N≈100 drive elements which are arranged one above the other in the form of a stack, are each of layered construction, and are provided with electrical connections. As FIG. 1 shows schematically, a drive element 1 may comprise a small silver, platinum or palladium plate 4, which is arranged between two electrical insulators 2, 3, and an actuator element 5 which is manufactured from a magnetostrictive material, in particular $Tb_{0.3}Dy_{0.7}Fe_2$ (TERFENOL-D). When current flows through it, the small metal plate 4, which is slotted from the middle of a side edge to the center, acts as a planar annular coil whose magnetic field passes through the actuator element 5, which is in the form of a right-parallelepiped or disk, and causes magnetostriction there. $SiO_2$, $Si_3N_4$, $Al_2O_3$ or polyimide layers may be used, in particular, as insulators 2, 3. The electrical insulation of the annular coil 4 can, of course, also be provided by laminating on a film, by coating with an epoxy resin or by oxidation of the magnetostrictive layer 5.

Figure 2:
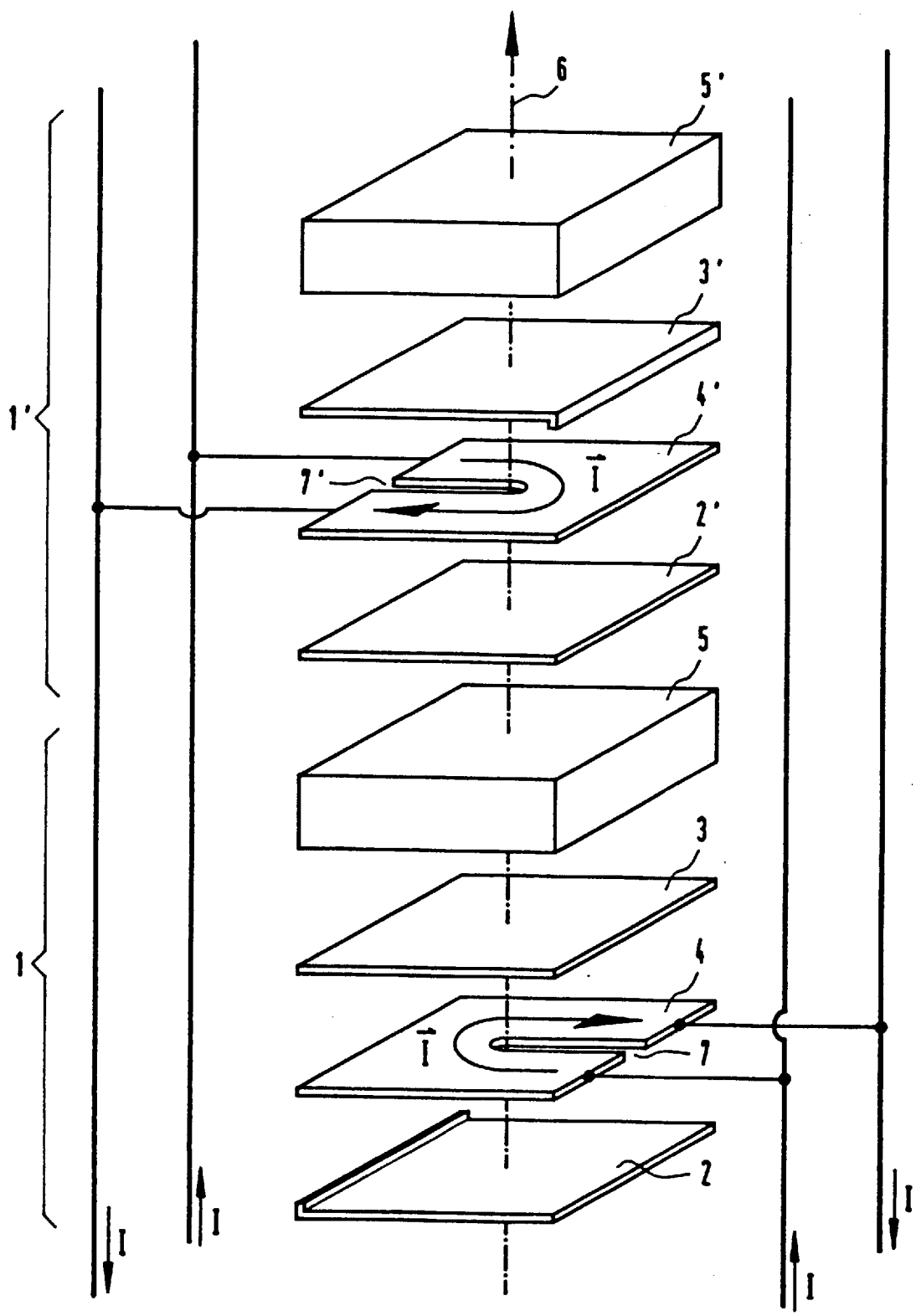
FIG. 2 shows two drive elements which are arranged at offset angles one above the other.

Because of its physical shape, the planar annular coil 4 cannot produce a magnetic field which is rotationally symmetrical with respect to the stack axis 6. The magnetostrictive element 5 which is subjected to such a field thus experiences asymmetric expansion, which, under some circumstances, causes very large mechanical stresses in the material. In order to prevent the actuator failing prematurely because of one of its drive elements 1, 1' fracturing, they are arranged at offset angles one above the other (see FIG. 2). A comparatively homogeneous magnetic field is formed in the region of the magnetostrictive layer 5 in particular if the slots 7, 7' of the annular coils 4, 4' include an azimuth angle of $\phi=180°$.

The integration of the magnetic coil in the drive element 1, 1' makes it possible to build compact actuators. In addition, the actuators respond very rapidly to drive signals since the planar annular coils 4, 4' each have only very small inductances. A further advantage over conventional actuators with their actuating elements arranged in the interior of cylindrical coils is that there is no need for any elements (pole shoes etc.) to guide the flux, and scarcely any field losses occur through air gaps.

Figure 3:
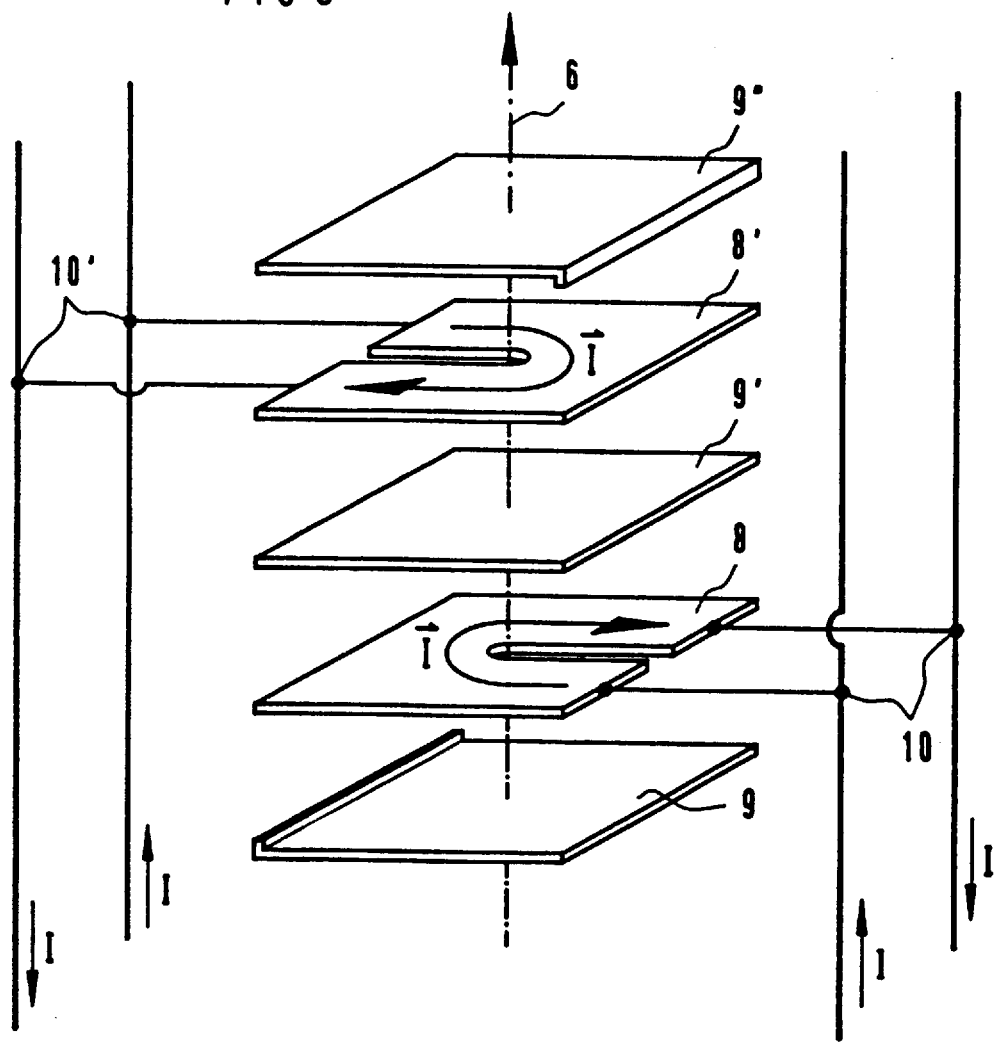
FIGS. 3 to 5 show further exemplary embodiments of actuators according to the invention.

The design of the actuator according to the invention can be further simplified by using the high electrical conductivity of magnetostrictive materials and constructing the actuator element itself as a planar annular coil. In this case, both the internal magnetic field (H~r), which is produced by the current flowing in the magnetostrictive material, and the external magnetic field (H~1/r) of adjacent annular coils now contribute to the desired effect. As FIG. 3 shows, such an actuator typically contains N≈100 small slotted Terfenol plates 8, 8', which are each arranged at offset angles between insulators 9, 9', 9" (azimuth angle $\phi=180°$) and are each provided with electrical connections 10, 10'.

In order to reduce the ohmic losses, to increase the corrosion resistance of the actuator and to improve the homogeneity of the magnetic induction in the magnetostrictive layers, the annular coils 9, 9' can also be coated with an electrically highly conductive material such as Au, Ag, Al, Cu, Ni, W, Ti, Pt or Pa. It is, of course, also possible to use metallic annular coils, which are coated with an electrostrictive material, in the actuator. A considerable increase in the magnetic induction can be achieved by manufacturing the conductor layer from a high-permeability material and/or by arranging a further layer which is composed of a ferromagnetic material (Co, Ni, Fe), on or in the vicinity of the field-producing/magnetostrictive elements 8, 8'. Physical and chemical deposition methods are used, in particular, for the production of the magnetostrictive layers, of the electrical conductors and of the high-permeability ferromagnetic layers. RF or DC sputtering, vapor deposition, CVD methods or electrochemical layer deposition may be mentioned here, by way of example.

Figure 4:
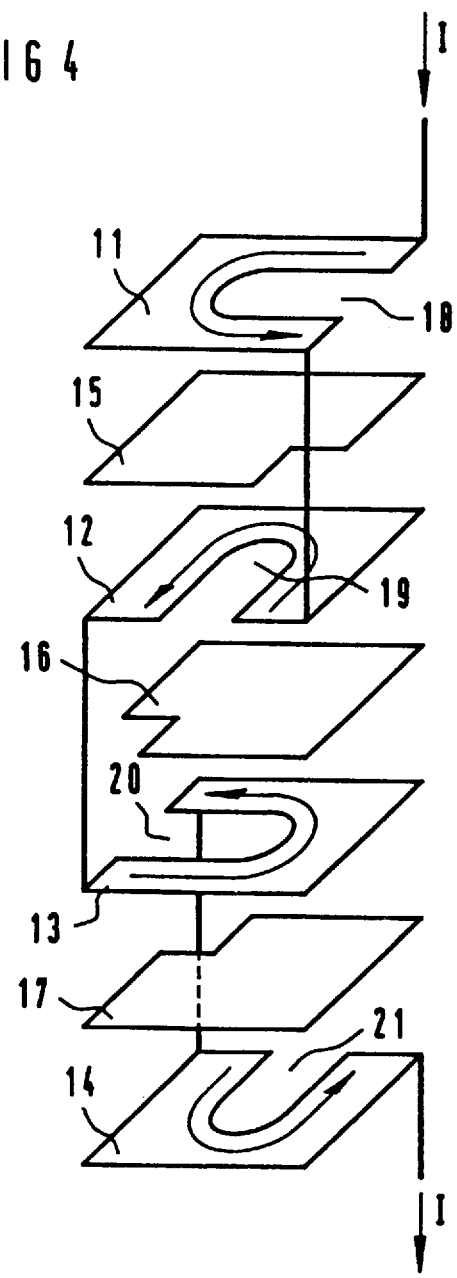

FIG. 4 shows a further exemplary embodiment of an actuator. In this case, the Terfenol sheets 11–14, which are slotted in a u-shape, and the insulator layers 15–17 are arranged alternately one above the other in such a manner that the current which is supplied to the upper annular coil 11 and flows away from the lower annular coil 14 flows through the actuator in a helical shape. In order to accomplish this, the slots 18–21 of adjacent annular coils 11–14 each include an azimuth angle of $\phi=90°$, the rotation direction within the stack being maintained. The magnetic field which is formed in the actuator now corresponds to that of a conventional cylindrical coil. It can be increased considerably by coating the planar annular coils 11 to 14 with a ferromagnetic material and/or by arranging ferromagnetic layers in the vicinity of the annular coils 11 to 14.

Figure 5:
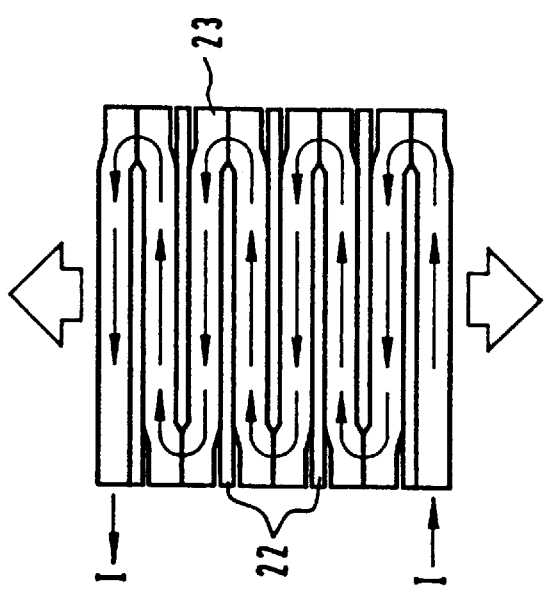

The actuator which is illustrated in FIG. 5 has a layered structure with alternately arranged laminates of magnetostrictive and electrically insulating material. The special alignment of the insulating intermediate layers 22, whose area is smaller than the magnetostrictive laminates 23, enables a continuous electrically conductive connection between the individual actuator elements, like a series circuit, even without any complex external contact being made. The meandering current path which is produced in this way leads to a homogeneous current density distribution in the conductive layers 23. In addition, the stray magnetic field is reduced to a very great extent.

Figure 6:
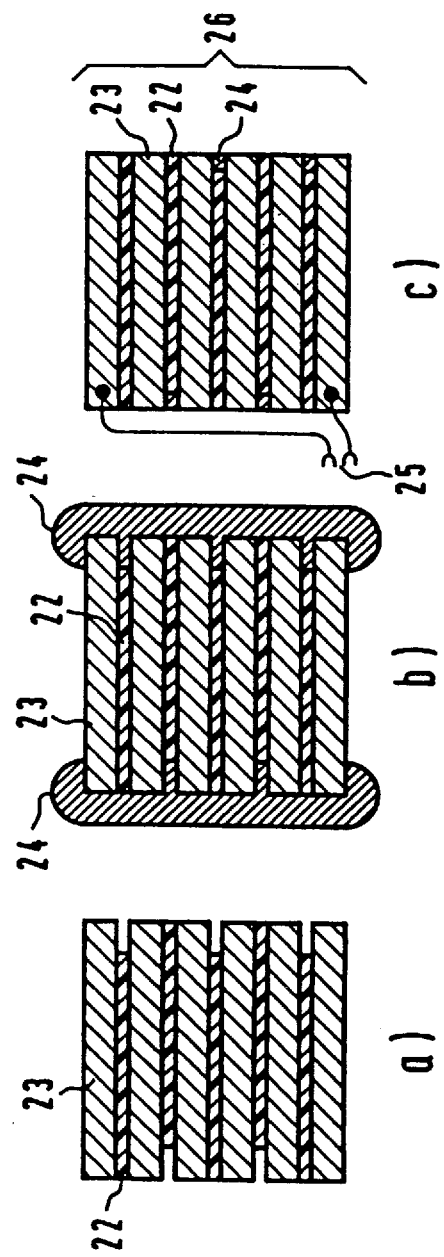
FIG. 6 shows method steps for producing a magnetostrictive multi-layer actuator.

FIG. 6 is used to explain a method for producing an actuator of layered construction. The desired number and sequence of layers—magnetostrictive material—insulator—magnetostrictive material—insulator—etc. is produced first of all, using a physical or chemical deposition process, and these layers are connected simply by pressing or sintering (FIG. 6a). Contact is made with the magnetostrictive layers 23 by filling in the intermediate spaces with an electrically conductive material 24 (for example Al, Au, Ag, Cu, Ni). The methods which are known from the production of multi-layer piezo-ceramics or multi-layer printed circuit boards are used in this case. Flame spraying, electrogalvanic deposition or chemogalvanic deposition may be mentioned here (FIG. 6b). FIG. 6c shows the actuator body 26, which is produced by sawing up, is provided with electrical connections 25, and is in the form of a right-parallelepiped, cylinder or ring. This actuator body 26 is also sheathed with passivation and is subsequently sintered (not illustrated).

The invention is not, of course, limited to the described exemplary embodiments. For example, in particular, the small metal plates which are designated 4 and 4' in FIGS. 1 and 2 can each be replaced by a U-shaped conductor element having comparatively narrow limbs. The magnetic field which is formed in the actuator is then considerably more homogeneous and is oriented approximately parallel to the stack axis 6.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A magnetostrictive actuator having a number $N \geq 2$ of drive elements, comprising: drive elements
    having a layered construction and each of the drive elements having
    a planar conductor element which is provided with electrical connections,
    an actuator element which is composed of a magnetostrictive material, and
    an electrical insulator which is arranged between the conductor element and the actuator element,
    the conductor elements having one of a U-shape configuration or being provided with a slot, the conductor elements arranged at offset angles one above the other within a stack of the drive elements such that a magnetic field is built up which is oriented in a direction of a stack axis of the stack.

2. The magnetostrictive actuator as claimed in claim 1, wherein adjacent conductor elements of the conductor elements are arranged offset at an angle of 180° one above the other.

3. The magnetostrictive actuator as claimed in claim 1, wherein each of the conductor elements are arranged between two insulators.

4. The magnetostrictive actuator as claimed in claim 1, wherein the insulators are composed of one of a dielectric, an insulating film or an insulating varnish and are produced by one of oxidation of a surface of the magnetostrictive material or by oxidation of a surface of the conductor elements.

5. The magnetostrictive actuator as claimed in claim 1, wherein the conductor or actuator elements which are composed of a magnetostrictive material, are coated with an electrically conductive material, or the conductor and/or actuator elements are mounted on an electrically conductive layer.

6. The magnetostrictive actuator as claimed in claim 5, wherein the electrically conductive material has ferromagnetic characteristics and/or the electrically conductive layer is composed of a ferromagnetic material.

7. A magnetostrictive actuators comprising:
    a number $N \geq 2$ of planar annular coils which are separated from one another by electrical insulators;
    each of the annular coils being manufactured from a magnetostrictive material,
    being provided with electrical connections and
    being arranged one above the other in a stack such that, when current is flowing, the annular coils produce a magnetic field which is oriented in a direction of a stack axis of the stack.

8. The magnetostrictive actuator as claimed in claim 7, wherein the conductor elements are slotted conductor elements in the form of plates, disks or rings.

9. The magnetostrictive actuator as claimed in claim 7, wherein the conductor elements are arranged at offset angles one above the other.

10. The magnetostrictive actuator as claimed in claim 9, wherein the conductor elements are arranged at offset angles one above the other such that a helical current path is produced.

11. A magnetostrictive actuator, comprising:
    a number $N \geq 2$ of planar conductor elements which are separated from one another by electrical insulators;
    the conductor elements being manufactured from a magnetostrictive material,
    being electrically connected in series and
    being arranged one above the other in a stack such that a current which is supplied to a connection of a first conductor element and which flows away via a connection of an N-th conductor element produces a magnetic field which is oriented in a direction of a stack axis of the stack.

12. The magnetostrictive actuator as claimed in claim 7, wherein the insulators are composed of one of a dielectric, an insulating film or an insulating varnish and are produced by one of oxidation of a surface of the magnetostrictive material or by oxidation of a surface of the conductor elements.

13. The magnetostrictive actuator as claimed in claim 7, wherein the conductor or actuator elements which are composed of a magnetostrictive material, are coated with an electrically conductive material, or the conductor and/or actuator elements are mounted on an electrically conductive layer.

14. The magnetostrictive actuator as claimed in claim 13, wherein the electrically conductive material has ferromagnetic characteristics and/or the electrically conductive layer is composed of a ferromagnetic material.

15. The magnetostrictive actuator as claimed in claim 7, wherein the conductor elements are planar annular coils.

16. The magnetostrictive actuator as claimed in claim 7, wherein the conductor elements are slotted conductor elements in the form of plates, disks or rings.

17. The magnetostrictive actuator as claimed in claim 7, wherein the conductor elements are arranged at offset angles one above the other.

18. The magnetostrictive actuator as claimed in claim 17, wherein the conductor elements are arranged at offset angles one above the other such that a helical current path is produced.

19. The magnetostrictive actuator as claimed in claim 1, wherein the insulators are composed of one of a dielectric, an insulating film or an insulating varnish and are produced by one of oxidation of a surface of the magnetostrictive material or by oxidation of a surface of the conductor elements.

20. The magnetostrictive actuator as claimed in claim 11, wherein the conductor or actuator elements which are composed of a magnetostrictive material, are coated with an electrically conductive material, or the conductor and/or actuator elements are mounted on an electrically conductive layer.

21. The magnetostrictive actuator as claimed in claim 20, wherein the electrically conductive material has ferromagnetic characteristics and/or the electrically conductive layer is composed of a ferromagnetic material.

* * * * *